United States Patent [19]

Ito et al.

[11] Patent Number: 5,028,451
[45] Date of Patent: Jul. 2, 1991

[54] METHOD OF PRODUCING SINTERED HARD METAL WITH DIAMOND FILM

[75] Inventors: Toshimichi Ito; Satoshi Katsumata, both of Chiba; Masakazu Watanabe; Satoshi Iio, both of Nagoya, all of Japan

[73] Assignees: Idemitsu Petrochemical Company Limited, Tokyo; NGK Spark Plug CP. Ltd., Aichi, both of Japan

[21] Appl. No.: 488,420

[22] Filed: Mar. 2, 1990

Related U.S. Application Data

[63] Continuation of Ser. No. 305,973, Feb. 3, 1989, abandoned.

[30] Foreign Application Priority Data

Feb. 4, 1988 [JP] Japan ................ 63-24832
Apr. 26, 1988 [JP] Japan ................ 63-104970

[51] Int. Cl.$^5$ .............................. B05D 3/06
[52] U.S. Cl. ..................... 427/39; 51/293; 51/295; 427/38; 427/45.1; 427/249; 427/255.3
[58] Field of Search ............ 51/295, 293, 308, 309; 427/35, 38, 39, 45.1, 249, 255.3

[56] References Cited

U.S. PATENT DOCUMENTS

| | | | |
|---|---|---|---|
| 4,504,519 | 3/1985 | Zelez | 427/39 |
| 4,668,538 | 5/1987 | Feichtner et al. | 427/249 |
| 4,702,960 | 10/1987 | Ogman | 427/249 |
| 4,716,048 | 12/1987 | Ishihara et al. | 427/39 |
| 4,756,964 | 7/1988 | Kincaid et al. | 427/249 |
| 4,761,308 | 8/1988 | Gebhardt et al. | 427/249 |
| 4,803,127 | 2/1989 | Hakim | 427/249 |
| 4,810,526 | 3/1989 | Ito et al. | 427/249 |
| 4,818,560 | 4/1989 | Ishihara et al. | 427/38 |
| 4,844,951 | 7/1989 | Sarin et al. | 427/249 |

FOREIGN PATENT DOCUMENTS

| | | |
|---|---|---|
| 0251264 | 1/1988 | European Pat. Off. |
| 0288065 | 10/1988 | European Pat. Off. |
| 0305903 | 3/1989 | European Pat. Off. |
| 126972 | 7/1983 | Japan . |
| 159981 | 9/1984 | Japan . |
| 208473 | 1/1985 | Japan . |
| 204695 | 10/1985 | Japan . |
| 61-52363 | 3/1986 | Japan . |
| 62-7267 | 2/1987 | Japan . |
| 63-15347 | 4/1988 | Japan . |

Primary Examiner—William R. Dixon, Jr.
Assistant Examiner—Willie J. Thompson
Attorney, Agent, or Firm—Browdy and Neimark

[57] ABSTRACT

The present invention is directed to a method of producing a sintered hard metal having a diamond film wherein a gas that is obtained by activating a raw material gas containing 2 to 60 mol % of carbon monoxide and hydrogen gas is brought in contact with a sintered hard metal to form a diamond film, thereby a diamond film can be formed on said sintered hard metal with the adhesion of the diamond excellent.

9 Claims, 1 Drawing Sheet

METHOD OF PRODUCING SINTERED HARD METAL WITH DIAMOND FILM

This application is a continuation of application Ser. No. 07/305,973 filed Feb. 3, 1989 abandoned.

BACKGROUND OF THE INVENTION (1) Field of the Invention

This invention relates to a method of producing a sintered hard metal with a diamond film, and more particularly to a method of producing a sintered hard metal with a diamond film suitable for, for example, various cutting tools such as bits, end mils, drills, and cutters, draw dies, blanking dies, abrasion resistant machine parts, and the like.

(2) Description of the Related Art

Conventionally, in the field of various cutting tools such as bits, end mils, and cutters, since cutting tools excellent abrasion resistance can be obtained by using a diamond film as a protective film for cutting tools made of a sintered hard metal, the demand for cutting tools made of a sintered hard metal on which a diamond film is formed is increasing.

Conventionally, as methods of forming a diamond film on a sintered hard metal have been suggested, for example, a method wherein, prior to the formation of a diamond film, a sintered hard metal is subjected to ion etching treatment thereby activating the surface of the sintered hard metal, and then the sintered hard metal is contacted with an activated raw material gas (see Japanese Laid-Open Patent Application No. 204695/1985), and a method wherein prior to the formation of a diamond film on a substrate of a cermet, the cermet is etched with an acid solution to remove the bonding phase of the surface, and then the cermet is contacted with an activated raw material gas (see Japanese Laid-Open Patent Application No. 52363/1986).

However, the cutting tools of a sintered hard metal formed with a diamond film that are obtained by these methods still are accompanied by such problems that the cutting edge is still abraded, that chipping (breaking part of the cutting edge) will occur, and that it is still hardly said that the adhesion of the diamond film is satisfactory.

Thus, generally the adhesion between the surface of a sintered hard metal and a diamond film is poor.

Therefore, in order to improve the adhesion between the surface of a sintered hard metal and diamond, techniques for forming an intermediate layer between a sintered hard metal and a diamond thin film are developed.

For example, Japanese Laid-Open Patent Application No. 126972/1983 discloses a method wherein after an intermediate layer made of one or more compounds selected from a carbide, a nitride, a boride, and an oxide of a metal of Groups IVa, Va, and VIa of the periodic table is first formed on the surface of a sintered hard metal, a diamond thin film is formed on the intermediate layer.

Also, Japanese Laid-Open Patent Application No. 159981/1984 discloses a tool that includes on a metal such as W, Nb, Ta, V, Cr, and Hf a diamond thin film formed by the CVD method or the like.

However, in either of the above Patent Applications, since the thin film is formed stepwise by forming first an intermediate layer and then the diamond thin film, it is hardly said that the adhesion between the sintered hard metal and the diamond thin film has been improved sufficiently enough to the practical level although the methods are allegedly intended to improve the adhesion.

Further, as a tool member coated with artificial diamond, a tool member coated with artificial diamond is suggested wherein at least the tool working surface of a cermet substrate member is coated with an artificial diamond film having an average layer thickness of 1 to 1.2 $\mu$m formed by an artificial diamond deposition formation process via a deposited layer having an average layer thickness of 0.05 to 1.2 $\mu$m made of any one of W, Mo, and Nb and their alloys [see Japanese Patent Publication No. 15347/1988 (Japanese Laid-Open Patent Application No. 208473/1985)].

However, since, in the method disclosed in the Japanese Patent Publication mentioned above, the composition of the reactant mixed gas for the formation of diamond is 1 vol. % or below, the deposited metal layer is not effectively carbonized. Therefore, the adhesion between the diamond layer and the cermet substrate member is accordingly poor.

SUMMARY OF THE INVENTION

The object of the present invention is to provide a method of producing a sintered hard metal with a diamond film excellent in the adhesion between the sintered hard metal and the diamond thin film.

In order to solve the above problems, the inventors have intensively studied, and have found that when a gas that comprises carbon monoxide and hydrogen gas mixed in a specified ratio and has been activated is brought in contact with a sintered hard metal, a sintered hard metal having a diamond film adhered firmly theron can be obtained, and that after a surface layer of a specified metal is formed on a sintered hard metal, when a gas that comprises carbon monoxide and hydrogen gas mixed in a specified ratio and has been activated is brought in contact with the surface layer, a sintered hard metal having a diamond film adhered firmly thereon can be obtained, leading to the present invention.

That is, the present invention is directed to a method of producing a sintered hard metal with a diamond film, characterized in that a raw material gas containing 2 to 60 mol % of carbon monoxide and hydrogen is activated, and the activated gas is brought in contact with a sintered hard metal to form a diamond film.

Also, the present invention is directed to a method of producing a sintered hard metal with a diamond film, characterized in that a raw material gas containing 2 to 60 mol % of carbon monoxide and hydrogen is activated, and the activated gas is brought in contact with a sintered hard metal having a surface layer made of at least one element selected from the group consisting of Si and metals of Groups IVa, Va or VIa of the periodic table to form a diamond film.

DESCRIPTION OF THE PREFERRED EMBODIMENTS

Sintered Hard Metal

Figure 1:
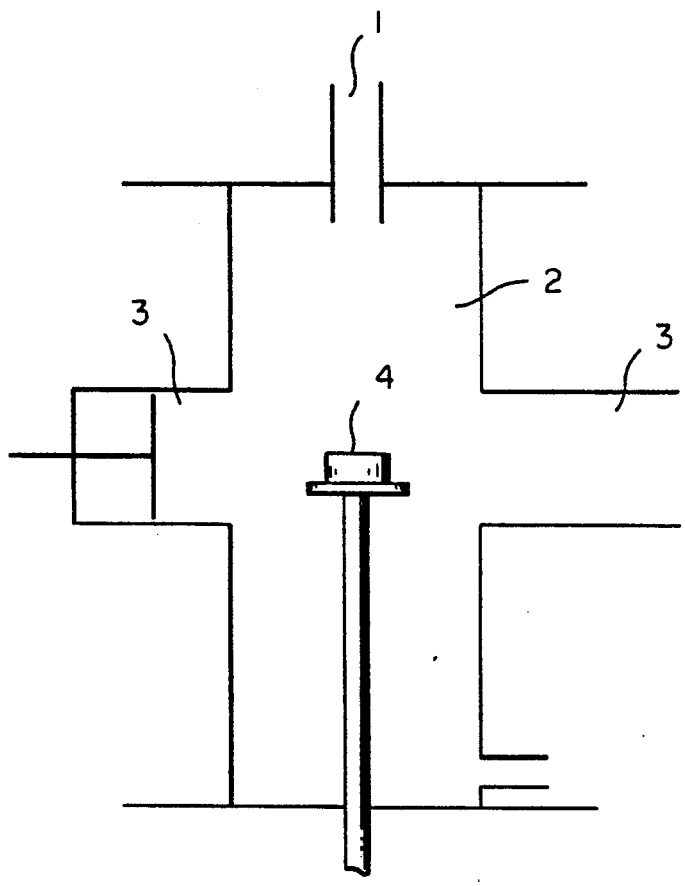
FIG. 1 is a general view of a reaction apparatus used in the present invention.

The sintered hard metal used in the present method is employed to serve as a base on which a diamond film will be formed.

There is no particular limitation on the sintered hard metal to be used, and, for example, use can be made of one containing at least one carbide comprising a metal selected from the group consisting of metals of Groups IIIb, IVa, IVb, Va, and VIa. For example one suitably selected from WC/Co alloys, WC/TiC/Co alloys, WC/TiC/TaC/Co alloys, WC/TiC alloys, WC/TiN alloys, and WC/TiCN alloys.

In the present invention, a sintered hard metal containing at least 80 wt. % of a WC component is preferable.

In addition to the above sintered hard metals, WC alloys, TiC alloys, TiN alloys, TiCN alloys, TiC/Mo/Ni alloys, TiC/TiN/Mo alloys, and TiC/TiN/Ni/Mo alloys can be exemplified.

The Surface Layer

In the present invention, although as a base the sintered hard metal can be used as it is, it is preferable that a surface layer of a specified element is previously formed on the surface of the sintered hard metal.

This is because if a surface layer of a metal is previously formed on the surface of a sintered hard metal, when a gas obtained by activating a raw material gas that will be described later is brought in contact with said surface layer, the adhesion between the sintered hard metal and the diamond film is more increased than in the case of the conventional sintered hard metal comprising a sintered hard metal, an intermediate layer, and a diamond layer.

The reason why the adhesion in the case of the conventional sintered hard metal having a diamond film is not increased is unknown for the present. It is supposed that in the conventional sintered hard metal having a diamond film diamond crystals having a large particle diameter are formed on the intermediate layer, and subtle clearances are formed between the intermediate layer surface and the diamond particles adjacent the intermediate layer, which clearances lower the adhesion.

In the present sintered hard metal having a diamond film, the reason why the diamond film has great adhesion will be presumably attributed to the following: when a specific excited gas is brought in contact with a specified metal layer of the present invention to start the reaction, since carbon monoxide is used as a raw material gas immediately after the start of the contact, and the content of the carbon monoxide is relatively high, carbide of said metal is formed and a reaction of the formation of very fine diamond particles also takes place after the start of the reaction so that the carbonizing reaction of the metal and the synthesis reaction of diamond proceed simultaneously, then, since, after the completion of the carbonizing reaction, fine crystalline diamond is formed, there are no clearances between the intermediate layer of the carbide of the metal and the diamond film, and in addition since the formed diamond is in the state of fine crystals, the contact area between the diamond and the surface of the metal carbide is very large.

It is important that fine crystalline diamond is formed. Since the diamond is fine crystalline, formation of a diamond film becomes possible, and the stress induced by the difference between the thermal expansion of the diamond and the thermal expansion of the sintered hard metal can be reduced, which also will contribute to the improvement of the adhesion of the diamond film.

Further although it has not yet been confirmed, such a possibility is considered that near the surface of the layer of the carbide of the metal formed by the contact of the excited gas, fine crystals of part of the diamond bite into said surface.

Anyway, the surface layer of the sintered hard metal before coated with diamond is made of at least one metal selected from the group consisting of Si and metals of Groups IVa, Va, and VIa of the periodic table.

As the metals of Groups IVa, Va, and VIa of the periodic table that will form the metal layer can be exemplified Ti, Zr, Hf, V, Nb, Ta, Cr, Mo and W.

The combination of the species of the metal that forms the sintered hard metal and the species of the metal that forms the metal layer is important.

It is preferable that the species of the metal that forms the sintered hard metal and the species of the metal that forms the metal layer are the same as far as possible. When they are the same, the adhesion between the surface layer and the sintered hard metal becomes high.

When the species of the metal that will form the sintered hard metal and the species of the metal that will be placed on the sintered metal are to be the same, the metal is preferably tungsten (W).

The layer of Si or a metal of Group IVa, Va, or VIa of the periodic table that will be placed on the sintered hard metal can be formed by a coating process.

The coating process includes, for example, vacuum deposition process, ion plating process, CVD process, plasma CVD process MOCVD process, and sputtering process.

The thickness of the layer of Si or a metal of Group IVa, Va, or VIa that is placed on the sintered hard metal is 0.05 to 1 $\mu$m, and preferably 0.1 to 0.5 $\mu$m.

When the thickness of the metal layer is less than 0.05 $\mu$m, the adhesion between the sintered hard metal and the diamond film cannot be made sufficient, and when the thickness exceeds 1 $\mu$m, the metal layer cannot be carbonized completely, and therefore the adhesion cannot be increased sufficiently. For instance, in the case wherein the metal layer is made of tungsten, an imperfect carbide such as $W_2C$ is produced, and it is presumed that this $W_2C$ is brittle in comparison with WC or the like.

Further, the particles of the intermediate layer formed by carbonizing the metal layer have a particle diameter of 0.5 $\mu$m or below, and particularly preferably on the order of 0.05 to 0.1 $\mu$m.

When the particles of the intermediate layer have a particle diameter of 0.5 $\mu$m or below, the surface of the intermediate layer becomes smooth, the particles of the diamond film that is formed become small, and the adhesion is improved.

Raw Material Gas

In the present method, a gas obtained by activating a raw material gas containing 2 to 60 mol % of carbon monoxide and hydrogen gas is brought in contact with the sintered hard metal.

The raw material gas may contain an inert gas to such a degree that it does not hamper the object of the present invention.

There is no particular limitation on the carbon monoxide to be used, and for example produced gas or water gas that will be obtained by reacting coal or coke with hot air or hot steam followed by sufficient purification can be employed.

There is no particular limitation on the hydrogen to be used, and for example hydrogen that is obtained by gasification of petroleums, denaturing of natural gas or water gas, hydrolysis of water, reaction between iron and steam, or complete gasification of coal followed by sufficient purification can be used.

In the present method, by bringing a gas obtained by exciting, as a raw material gas, a mixed gas containing carbon monoxide in an amount of 2 to 60 mol %, preferably 3 to 40 mol %, and more preferably 3 to 30 mol % in contact with a sintered hard metal or a surface layer formed on a sintered hard metal, a diamond film can be deposited on the sintered hard metal with the adhesion favorably.

If the content of carbon monoxide in the mixed gas is less than 2 mol % and the sintered hard metal is used directly as a base, the etching effect of carbon monoxide on the sintered hard metal will become poor, while if the content of carbon monoxide exceeds 60 mol %, the sintered hard metal will be etched violently, there the adhesion of the diamond film will become poor, and the crystally of the diamond will be lowered.

In the present invention, it is considered that the reason why the adhesion between the diamond film and the sintered hard metal is improved by restricting the content of carbon monoxide to the specified range resides in that suitable etching on the sintered hard metal can carried out, thus between the diamond film and the sintered hard metal is formed a layer of a mixture of the respective components, and thereby a firm bond is obtained between the diamond layer and the sintered hard metal.

If the content of carbon monoxide in the mixed gas is lower when diamond film is formed on a surface layer made of at least said one element on a sintered hard metal, carbide of said element is not formed enough and the adhesion of the diamond film becomes worse. If the content of carbon monoxide in it is higher in the above same case, there is no effect by increasing the content of it.

Although hydrogen gas is used as a gas for diluting the carbon monoxide gas and also is used as a gas for producing a plasma when the raw material gas is to be plasma-decomposed, the hydrogen gas also has a function for cutting the C—H bond that will be formed on the surface of the sintered hard metal when diamond is formed thereby facilitating the formation of diamond.

When this hydrogen gas is used, the concentration of the hydrogen gas in the raw material gas is 98 to 40 mol %, preferably 97 to 60 mol % and more preferably 97 to 70 mol %.

An inert gas can be used as a carrier gas for the mixed gas of carbon monoxide and hydrogen.

As the inert gas can be mentioned, for example, nitrogen gas, argon gas, neon gas, and xenon gas.

Activation of the Raw Material Gas and Formation of Diamond

As means of activating the raw material gas use can be made of any one of various techniques conventionally used for synthesizing diamond.

Specifically, examples of means of activating the raw material include various plasma decomposition processes including a process wherein a DC voltage is applied between electrodes to effect plasma decomposition, a process wherein high frequency is applied between electrodes to effect plasma decomposition, a process wherein microwaves are used for plasma decomposition, and an ion beam process wherein plasma decomposition is carried out in an ion chamber or by an ion gun, and ions are taken out by an electric field, and a thermal decomposition process wherein thermal decomposition is effected by heating by a hot filament, with preference given to plasma decomposition processes.

In the present method, generally a diamond film is formed on a sintered hard metal under conditions given below.

That is, although the surface temperature of the sintered hard metal depends on the means of activating the raw material gas and therefore cannot be determined generally, the surface temperature is generally 400° to 1,200° C., and preferably 450° to 1,100° C. for example in the case of plasma decomposition. If this temperature is lower than 400° C., sometimes the formation rate of the diamond film is decreased. On the other hand, if this temperature exceeds 1,200° C., sometimes the diamond film deposited on the sintered hard metal is removed by etching, making the formation of the diamond film slow.

The reaction pressure is $10^{-3}$ to $10^3$ Torr, and preferably 1 to 800 Torr. If the reaction pressure is less than $10^{-3}$ Torr, sometimes the formation rate of the diamond film becomes slow. On the other hand, if the reaction pressure is higher than $10^3$ Torr, the corresponding effect cannot be exhibited, and in some cases it will result in the lowering of the formation rate of the diamond film.

The reaction time can be set suitably depending on the desired thickness of the diamond film and on the formation rate of the diamond film.

Further, the plasma output in the case wherein the raw material gas is plasma-decomposed is generally 0.1 kw or over. If the plasma output is less than 0.1 kw, sometimes the plasma is not produced sufficiently.

The reaction under the above conditions can be carried out, for example, by a reaction apparatus as shown in FIG. 1.

FIG. 1 is a general view of a reaction apparatus that can be used in the present method.

That is, the raw material gas containing carbon monoxide gas and hydrogen gas is introduced into a reaction vessel 2 via a raw material gas inlet 1. The raw material gas introduced into the reaction vessel 2 is plasma-decomposed by microwaves or high-frequency waves from a waveguide 3 to be activated, and the carbon in the excited state contained in the activated gas deposits on a substrate made of a sintered hard metal.

In the case wherein a layer of a specified metal is previously formed on the surface of a sintered hard metal, when the gas obtained by activating the raw material gas is brought in contact with the layer, the layer is carbonized, and formation of diamond occurs partially, so that a diamond film is formed on the carbonized metal layer. As a result, a diamond film good in adhesion is formed.

In the present invention, the diamond film formed in the manner mentioned above is a film of diamond and/or diamond-like carbon (DLC).

The sintered hard metal having a diamond film obtainable by the present invention can be used suitably for various cutting tools such as bits, cutters, and end mils, draw dies, blanking dies, abrasion resistant machine parts, and the like.

Now, the present invention will be described particularly with reference to Examples according to the present invention and Comparative Examples.

EXAMPLES 1 TO 6

Each cutting tip of a sintered hard metal [WC/Co/TiC/TaC (94/5/0.5/0.5)] (JIS K 10 SPGN 422) was used as a substrate and was placed in the reaction chamber, the output of the microwave power source having a frequency of 2.45 GHz was set at 400 W under such conditions that the substrate temperature was 900° C., and the pressure in the reaction chamber was 50 Torr, the raw material gas flow rate into the reaction chamber was set at the values as shown in Table 1, and the reaction was carried out for periods as shown in Table 1, so that a deposit having an average film thickness of 6 μm was formed on the substrate controlled to said temperature.

The crystallinity of each of the obtained deposits was assessed by using Raman spectroscopy analysis, and the cutting performance was examined. The results are shown in Table 1.

Each of the cutting tips formed with a diamond film was subjected to a cutting test under the following conditions.

Assessment of the crystallinity: Raman spectroscopy analysis

Assessment of cutting performance: after subjecting the tip to the test under the conditions given below, the edge was subjected to SEM observation.

Material that was cut: Al/8 wt. % Si alloy
Cutting speed: 800 m/min
Feed: 0.1 mm/rev.
Depth of cut: 0.25 mm
Cutting time: 10 min After the test, fused matter of the material that was cut was removed by using diluted hydrochloric acid, and the state of the cutting edge of the cutting tip was observed by a scanning type electron microscope (JSM840: manufactured by Nihon Denshi Kabushiki-kaisha). Each of the cutting tip was free from abrasion and tipping, and it was confirmed that the state thereof was normal.

COMPARATIVE EXAMPLE 1

Example 1 was repeated, except that the concentration of carbon monoxide was outside the range of the present invention as shown in Table 1.

The obtained cemented carbide cutting tool was subjected to the same test as Example 1. The result is shown in Table 1.

COMPARATIVE EXAMPLES 2 TO 4

Formation of each diamond film was carried out in the same manner as Example 1, except that as raw material gas use was made of $CH_4$ and $H_2$, thereby providing a diamond film having an average thickness of 6 μm, and the cutting test was carried out under the same conditions as Example 1.

The results are shown in Table 2.

Exfoliation of the diamond film at the cutting edge of the cutting tips was observed, and it was confirmed that the adhesion of the diamond films obtained in these Examples was poor.

TABLE 1

| No. | Raw material gas | | | Reaction time (h) | Crystallinity | State of exfoliation after the cutting test |
|---|---|---|---|---|---|---|
| | CO (sccm) | $H_2$ (sccm) | CO concentration (%) | | | |
| Example 1 | 3 | 97 | 3 | 2.5 | ⊙ | Δ |
| Example 2 | 5 | 95 | 5 | 2 | ⊙ | |
| Example 3 | 10 | 90 | 10 | 1 | ⊙ | |
| Example 4 | 15 | 85 | 15 | 1 | ⊙ | |
| Example 5 | 20 | 80 | 20 | 1 | ⊙ | |
| Example 6 | 25 | 75 | 25 | 0.8 | | Δ |
| Comparative Example 1 | 1 | 99 | 1 | 5 | ⊙ | X |

Note: In Tables 1 and 2, with respect to the crystallinity,
⊙ denotes the crystallinity was very good;
denotes the crystallinity was good; and
with respect to the state of exfoliation,
denotes there was no abration and chipping.
Δ denotes there was abration.
X denotes there was exfoliation.

TABLE 2

| No. | Raw material gas | | | Reaction time (h) | Crystallinity | State of exfoliation after the cutting test |
|---|---|---|---|---|---|---|
| | $CH_4$ (sccm) | $H_2$ (sccm) | $CH_4$ concentration (%) | | | |
| Comparative Example 2 | 0.5 | 99.5 | 0.5 | 12 | ⊙ | X |
| Comparative Example 3 | 1 | 99 | 1 | 6 | X | X |
| Comparative Example 4 | 3 | 97 | 3 | 4 | X | X |

EXAMPLES 7 TO 13, COMPARATIVE EXAMPLE 5, AND REFERENCE EXAMPLES 1 TO 3

Each of cutting tips of a sintered hard metal [WC/Co (95/5)] (JIS K 10 SPGN 422) was washed with Rangel E (diluted 10 times and having a temperature 50° C.; manufactured by Nikkaseiko Kabushiki-kaisha) three times, then with pure water three times and with isopropyl alcohol three times to remove the soil, grease, rust, etc. from the surface. The period of each washing was 60 sec, the second washing in the three washing operations was carried out by using ultrasonic treatment additionally.

Then the surface of the cutting tip was coated with tungsten by vacuum deposition.

The conditions of the vacuum deposition were as follows:

Degree of vacuum: $10^{-5}$ Torr
Temperature of the cutting tip: 300° C.
Deposition speed: 10 Å/sec Then the cutting tip was placed as a substrate in the reaction chamber, the output of the microwave power source having a frequency of 2.45 GHz was set at 350 W under such conditions that the substrate temperature was 900° C., and the pressure in the reaction chamber was 50 Torr, the total amount of carbon monoxide gas and hydrogen gas as the raw material gas flowed into the reaction chamber was set at 100 sccm, the concentration of the carbon monoxide gas was set as shown in Table 3, and the reaction was carried out for the periods as shown in Table 3, thereby forming a deposit on the substrate controlled to the above temperature. By XRD, the metal layer on the cutting tip after contact with the raw material gas and the intermediate layer of said deposited layer were analyzed to determine the component.

When the surface of the deposit was subjected to Raman spectroscopy analysis, a peak due to diamond was observed near 1,333 cm$^{-1}$ of the Raman spectrum, and thereby it was confirmed that it was a diamond thin film free from impurities.

The intermediate layer formed on each cutting tip, and the thickness and the particle diameter (in μm) of the diamond thin film were measured by the SEM image.

The cutting tip having a diamond thin film through an intermediate layer was subjected to a cutting test under the following conditions.

Material that was cut: Al/8 wt. % Si alloy
Cutting speed: 800 m/min
Feed: 0.1 mm/rev.
Depth of cut: 0.25 mm
Cutting time: 10 min, 100 min, 1,000 min After the test, fused matter of the material that was cut was removed by using diluted hydrochloric acid, and the state of the cutting edge of the cutting tip was observed by a scanning type electron microscope (JSM840: manufactured by Nihon Denshi Kabushikikaisha).

The test results and the observation results thus obtained are shown in Table 3.

EXAMPLES 14 TO 16

Example 8 was repeated, except that the surfaces of cutting tips were coated with, instead of tungsten, silicon (Example 14), titanium (Example 15), and hafnium (Example 16), respectively, and the thickness of the intermediate layer was made the same as Example 10.

The results are shown in Table 3.

EXAMPLE 17

Example 8 was repeated, except that as the sintered hard metal of the cutting tip, JIS K20 [WC/Co/TiC/TaC (93/6/0.5/0.5)] was used.

The results are shown in Table 3.

COMPARATIVE EXAMPLE 6

On the surface of the same washed cutting tip as in Example 7 was formed a WC film having a thickness of 0.5 μm by flowing a mixed gas stream of WF$_6$, CH$_4$ and H$_2$ (having a mixing ratio of 1/2/97) at 50 Torr for 30 min while heating it to 900° C.

The cutting tip having the WC film was treated in the same manner as Example 7 to form a diamond thin film thereon.

The results are shown in Table 3.

TABLE 3

| | Intermediate layer | | | | | | Conditions of formation of the diamond thin film | |
|---|---|---|---|---|---|---|---|---|
| | Before the formation of the diamond thin film | | | After the formation of the diamond thin film | | | CO | |
| | XRD | Particle diameter (μm) | Film thickness (μm) | XRD | Particle diameter (μm) | Film thickness (μm) | concentration (%) | Synthesis time (h) |
| Example 7 | W | 0.05 | 0.1 | WC | 0.06 | 0.1 | 25 | 1 |
| Example 8 | W | 0.05 | 0.5 | WC | 0.06 | 0.6 | 20 | 1 |
| Example 9 | W | 0.05 | 1.0 | WC | 0.06 | 1.2 | 20 | 1 |
| Example 10 | W | 0.05 | 0.5 | WC | 0.06 | 0.6 | 3 | 6 |
| Example 11 | W | 0.05 | 0.5 | WC | 0.06 | 0.6 | 15 | 1.5 |
| Example 12 | W | 0.05 | 0.5 | WC | 0.06 | 0.6 | 50 | 1 |
| Example 13 | W | 0.05 | 0.1 | WC | 0.06 | 0.1 | 30 | 1 |
| Reference Example 1 | W | 0.05 | 0.04 | WC | 0.06 | 0.04 | 20 | 1 |
| Reference Example 2 | W | 0.05 | 2.0 | WC, W$_2$C | 0.05 | 2.2 | 20 | 1 |
| Comparative Example 5 | W | 0.05 | 0.5 | WC, W$_2$C | 0.05 | 0.5 | 1 | 8 |
| Reference Example 3 | W | 0.05 | 0.5 | WC | 0.06 | 0.6 | 20 | 0.1 |
| Example 14 | Si | 0.15 | 0.5 | SiC | 0.1 | 0.4 | 20 | 1 |
| Example 15 | Ti | 0.1 | 0.5 | TiC | 0.1 | 0.5 | 20 | 1 |
| Example 16 | Hf | 0.08 | 0.5 | HfC | 0.08 | 0.5 | 20 | 1 |
| Example 17 | W | 0.05 | 0.5 | WC | 0.05 | 0.6 | 20 | 1 |
| Comparative Example 6 | WC | 0.1 | 0.5 | WC | 0.1 | 0.5 | 20 | 1 |

| | Diamond thin film | | |
|---|---|---|---|
| | Particle | Film | Adhesion |

TABLE 3-continued

|  | Crystal-linity | diameter (μm) | thick-ness (μm) | Cutting time (min.) 10 | 100 | 1,000 |
|---|---|---|---|---|---|---|
| Example 7 | D | 0.6 | 2.5 |  |  | Δ |
| Example 8 | D | 0.5 | 2.4 |  |  |  |
| Example 9 | D | 0.5 | 2.2 |  |  |  |
| Example 10 | D | 1 | 3.6 |  |  | Δ |
| Example 11 | D | 0.7 | 3.0 |  |  |  |
| Example 12 | D + DLC | 1.0 | 2.1 |  |  | Δ |
| Example 13 | D | 0.8 | 3.0 |  |  | Δ |
| Reference Example 1 | D | 3 | 2.5 | Δ | X |  |
| Reference Example 2 | D | 0.5 | 2.3 | Δ | X |  |
| Comparative Example 5 | D | 1.5 | 2.4 | Δ | X |  |
| Reference Example 3 | D | 0.5> | 0.15 | Δ | X |  |
| Example 14 | D | 0.5 | 2.4 |  |  | Δ |
| Example 15 | D | 0.5 | 2.4 |  |  | Δ |
| Example 16 | D | 0.5 | 2.4 |  |  | Δ |
| Example 17 | D | 0.5 | 2.4 |  |  | Δ |
| Comparative Example 6 | D | 1.5 | 2.4 | Δ | X |  |

Note:
D = diamond
DLC = diamond-like carbon
○ = adhesion was good and there was no exfoliaton
Δ = there was partial exfoliation
X = adhesion was poor and there was exfoliation According to the present invention:

(1) A sintered hard metal having a diamond thin film can be provided wherein the adhesion between the sintered hard metal and the diamond thin film is higher than that of conventional sintered hard metals having a diamond thin film;

(2) A tool that is made of a sintered hard metal having a diamond thin film with the adhesion of the diamond film excellent, and is excellent in abrasion resistance and free from exfoliation can be provided; and (3) If the surface of a sintered hard metal is rough, since the surface is coated with a metal layer, the surface on which a diamond thin film will be formed can be made uniform, therefore a dense diamond thin film can be formed, and the above-mentioned sintered hard metal having a diamond thin film with the adhesion of the diamond film excellent can be produced easily by simple operations.

What is claimed is:

1. A method of producing a sintered hard metal having a diamond film, characterized in that a gas that is obtained by activating a raw material gas containing 2 to 60 mol % carbon monoxide and hydrogen gas is brought in contact with a sintered hard metal to form a diamond film, wherein said sintered hard metal has a surface layer made of at least one element selected from the group consisting of Si and metals of Group IVa, Va or VIa.

2. A method of producing a sintered hard metal having a diamond film as claimed in claim 1, characterized in that the metal species of said sintered hard metal and the metal species of said surface layer are the same.

3. A method of producing a sintered hard metal having a diamond film as claimed in claim 1, characterized in that the major component of the metal species in said sintered hard metal is tungsten.

4. A method of producing a sintered hard metal having a diamond film as claimed in claim 1, characterized in that the thickness of said surface layer is 0.05 to 1 μm.

5. A method of producing a sintered hard metal having a diamond film as claimed in claim 1, characterized in that said surface layer is formed by a vacuum deposition process.

6. A method of producing a sintered hard metal having a diamond film as claimed in claim 1, characterized in that the activation of said raw material gas is effected by a plasma decomposition process.

7. A sintered hard metal having a diamond film, characterized by comprising a sintered hard metal,
a surface layer formed by bringing a gas obtained by activating a raw material gas containing 2 to 60 mol % carbon monoxide and hydrogen gas in contact with a layer made on said sintered hard metal, of at least one element selected from the group consisting of Si and metals of Group IVa, Va or VIa and Si having a thickness in the range of 0.05 to 1 μm and
a diamond film formed on said surface layer and having a thickness of 0.2 to 100 μm.

8. A cutting tool characterized by being provided with said sintered hard metal with a diamond film according to claim 7.

9. A cutting tool having diamond film, characterized by that said diamond film is formed by bringing gas obtained by activating a raw material gas containing 2 to 60 mol % carbon monoxide and hydrogen gas in contact with a sintered hard metal.

* * * * *

UNITED STATES PATENT AND TRADEMARK OFFICE
CERTIFICATE OF CORRECTION

PATENT NO. : 5,028,451

DATED : July 2, 1991

INVENTOR(S) : ITO et al.

Page 1 of 3

It is certified that error appears in the above-identified patent and that said Letters Patent is hereby corrected as shown below:

On the title page, Item

[73] Assignee, third line: Delete "CP. Ltd.,", insert therefor -- Co. Ltd., --

Column 8, Delete Table 1, insert the following:

TABLE 1

| No. | Raw material gas | | | Reaction time (h) | Crystallinity | State of exfoliation after the cutting test |
|---|---|---|---|---|---|---|
| | CO (sccm) | $H_2$ (sccm) | CO concentration (%) | | | |
| Example 1 | 3 | 97 | 3 | 2.5 | ⊚ | △ |
| Example 2 | 5 | 95 | 5 | 2 | ⊚ | O |
| Example 3 | 10 | 90 | 10 | 1 | ⊚ | O |
| Example 4 | 15 | 85 | 15 | 1 | ⊚ | O |
| Example 5 | 20 | 80 | 20 | 1 | ⊚ | O |
| Example 6 | 25 | 75 | 25 | 0.8 | O | △ |
| Comparative Example 1 | 1 | 99 | 1 | 5 | ⊚ | X |

Note: In Tables 1 and 2, with respect to the crystallinity,
⊚ denotes the crystallinity was very good;
O denotes the crystallinity was good; and
with respect to the state of exfoliation,
denotes there was no abrasion and chipping
△ denotes there was abrasion.
X denotes there was exfoliation.

UNITED STATES PATENT AND TRADEMARK OFFICE
CERTIFICATE OF CORRECTION

PATENT NO. : 5,028,451
DATED : July 2, 1991
INVENTOR(S) : ITO et al

It is certified that error appears in the above-identified patent and that said Letters Patent is hereby corrected as shown below:

Column 10, last two lines:  Delete

"Diamond thin film
    Particle Film   Adhesion"

Columns 11 and 12  Delete TABLE 3-continued, insert the following:

UNITED STATES PATENT AND TRADEMARK OFFICE
CERTIFICATE OF CORRECTION

PATENT NO. : 5,028,451

DATED : July 2, 1991

INVENTOR(S) : ITO et al

It is certified that error appears in the above-identified patent and that said Letters Patent is hereby corrected as shown below:

TABLE 3-continued

| | | Diamond thin film | | | | |
| --- | --- | --- | --- | --- | --- | --- |
| | Crystal-linity | Particle diameter (μm) | Film thickness (μm) | Adhesion Cutting time (min.) | | |
| | | | | 10 | 100 | 1,000 |
| Example 7 | D | 0.6 | 2.5 | O | O | Δ |
| Example 8 | D | 0.5 | 2.4 | O | O | O |
| Example 9 | D | 0.5 | 2.2 | O | O | O |
| Example 10 | D | 1 | 3.6 | O | O | Δ |
| Example 11 | D | 0.7 | 3.0 | O | O | O |
| Example 12 | D + DLC | 1.0 | 2.1 | O | O | Δ |
| Example 13 | D | 0.8 | 3.0 | O | O | Δ |
| Reference Example 1 | D | 3 | 2.5 | Δ | X | |
| Reference Example 2 | D | 0.5 | 2.3 | Δ | X | |
| Comparative Example 5 | D | 1.5 | 2.4 | Δ | X | |
| Reference Example 3 | D | 0.5> | 0.15 | Δ | X | |
| Example 14 | D | 0.5 | 2.4 | O | O | Δ |
| Example 15 | D | 0.5 | 2.4 | O | O | Δ |
| Example 16 | D | 0.5 | 2.4 | O | O | Δ |
| Example 17 | D | 0.5 | 2.4 | O | O | Δ |
| Comparative Example 6 | D | 1.5 | 2.4 | Δ | X | |

Note
D = diamond
DLC = diamond-like carbon
O = adhesion was good and there was no exfoliation
Δ = there was partial exfoliation
X = adhesion was poor and there was exfoliation Signed and Sealed this Eleventh Day of May, 1993

MICHAEL K. KIRK

*Attest:*

*Attesting Officer*    *Acting Commissioner of Patents and Trademarks*